(12) United States Patent
Joist

(10) Patent No.: US 8,979,220 B2
(45) Date of Patent: Mar. 17, 2015

(54) LOCKING ELEMENT FOR LOCKING OF A PANEL COVER ON A MODULE RAIL

(71) Applicant: Schroff GmbH, Straubenhardt (DE)

(72) Inventor: Michael Joist, Gaggenau (DE)

(73) Assignee: Pentair Technical Solutions GmbH, Straubenhardt (DE)

( * ) Notice: Subject to any disclaimer, the term of this patent is extended or adjusted under 35 U.S.C. 154(b) by 0 days.

(21) Appl. No.: 13/954,123

(22) Filed: Jul. 30, 2013

(65) Prior Publication Data

US 2014/0049143 A1 Feb. 20, 2014

(30) Foreign Application Priority Data

Aug. 14, 2012 (EP) .................................... 12180455

(51) Int. Cl.
  *H05K 5/00* (2006.01)
  *H05K 5/02* (2006.01)
  *H05K 7/18* (2006.01)

(52) U.S. Cl.
  CPC ............ *H05K 5/0221* (2013.01); *H05K 5/0204* (2013.01); *H05K 5/0217* (2013.01); *H05K 7/18* (2013.01)
  USPC ....................... 312/223.2; 312/222; 312/265.6

(58) Field of Classification Search
  USPC ........... 312/223.2, 215, 216, 217, 222, 265.5, 312/265.6; 292/137, 138, 140, 155, 251, 292/DIG. 11
  See application file for complete search history.

(56) References Cited

U.S. PATENT DOCUMENTS

| | | | | |
|---|---|---|---|---|
| 3,006,179 | A * | 10/1961 | Erickson | 70/129 |
| 5,352,002 | A * | 10/1994 | Vouillon et al. | 292/155 |
| 6,698,853 | B2 * | 3/2004 | Chen et al. | 312/263 |
| 6,721,183 | B1 * | 4/2004 | Chen et al. | 361/726 |
| 7,259,959 | B2 * | 8/2007 | Tu et al. | 361/679.33 |
| 7,758,133 | B2 * | 7/2010 | Chen et al. | 312/223.2 |
| 7,782,611 | B2 * | 8/2010 | Yeh et al. | 361/679.57 |
| 2005/0017608 | A1 * | 1/2005 | Lin et al. | 312/223.2 |
| 2010/0244639 | A1 * | 9/2010 | Chen et al. | 312/223.2 |
| 2012/0019116 | A1 | 1/2012 | Fan | |
| 2012/0274083 | A1 * | 11/2012 | O'Hanlon | 292/155 |
| 2013/0221688 | A1 * | 8/2013 | Stadler | 292/155 |

FOREIGN PATENT DOCUMENTS

| | | |
|---|---|---|
| EP | 1 001 669 A3 | 5/2000 |
| JP | 2002-217572 A | 8/2002 |
| JP | 2004-251055 A | 9/2004 |

* cited by examiner

*Primary Examiner* — Daniel Rohrhoff
(74) *Attorney, Agent, or Firm* — Bose McKinney & Evans LLP

(57) ABSTRACT

A locking element for locking of a panel cover on a module rail includes a bearing block with a flat mounting surface and threaded holes for mounting on the inside of the panel cover and a slide lock, which is mounted to move on the bearing block and has a locking tab. A sliding mechanism moves the slide lock from a locked position, in which the locking tab engages beneath the module rail, to a release position and vice versa. An actuating screw forms a rotary actuator, which can be activated through a hole in panel cover when the locking element is engaged.

15 Claims, 4 Drawing Sheets

LOCKING ELEMENT FOR LOCKING OF A PANEL COVER ON A MODULE RAIL

RELATED APPLICATIONS

This application claims priority to EP 12 180 455.3, filed Aug. 14, 2012 which is hereby incorporated by reference in its entirety.

BACKGROUND

The invention concerns a locking element for locking of a panel cover on a module rail.

Panel covers are used in 19-inch racks to cover housing parts, especially subracks. Such a housing has two vertical side walls, which are connected to each other on their top and bottom via two horizontal module rails each. Guide rails can be provided on these module rails, into which circuit boards with electronic components can be inserted.

Fastening of the panel covers on the housing ordinarily occurs by engagement in the module rails and connection with the side walls. For this purpose the panel covers are flanged on their edges. The flanges on the sides facing the module rails engage in grooves in the module rails. EMC seals, like contact springs, can be provided in these grooves in order to shield the surroundings from electromagnetic radiation of the installed electronic components. The flanges on the sides of the panel covers facing the side walls are perforated with drill holes through which the panel covers are screwed to the side walls of the subrack.

If 19-inch racks are to withstand increased loads, like high static or dynamic loads, not only must the profiles of the module rails be adjusted to higher requirements, but fastening of the panel covers must also be adjusted in design to the increased load. Especially with large housing widths and high shock and vibration loads, insertion of the flanged panel cover into a groove of the module rail is no longer sufficient for secure joining between the panel cover and module rail. High loads during operation could mean that the panel cover will slide out of the groove of the module rail. Secure joining between the panel cover and housing and therefore EMC shielding relative to the surroundings would then no longer be present.

SUMMARY

Given the problem described above, this disclosure teaches a locking element that also assures secure fastening of a panel cover to a module rail at high loads, in which case this fastening is to be easily loosened without disassembly of the components or removal of plug-in units in order to take off the panel cover, when required.

The locking element according to this disclosure includes a bearing block with an essentially flat mounting surface and fasteners for mounting on the inside of the panel cover. The mounting surface forms a contact surface for support of the bearing block on the panel cover. Simple fastening of the bearing block by means of fasteners to the inside of the panel cover is made possible on this account.

The locking element also includes a slide lock, which is mounted to move on the bearing block and has a locking tab. The slide lock is preferably movable parallel to the bearing block and in its longitudinal direction. Different positions of the slide lock relative to the bearing block can therefore be achieved.

A slide mechanism is also provided, which moves the slide lock from a locking position to a release position and vice versa. In the blocking position the locking tab engages beneath the module rail. Removal of the panel cover from the module rail is therefore impossible.

The locking mechanism is driven via a rotary actuator which can be activated in the installed locking element through a hole in the panel cover. The rotary actuator of the locking mechanism is consequently easily accessible from the outside of the panel cover so that activation of the slide lock is made possible without disassembling other components and especially without removing electronic assemblies from the housing. The slide lock can be transferred into the release position merely by engagement from the outside of the panel cover so that removal of the panel cover can occur very easily and simply. On the other hand, the panel cover can also be repositioned simply and locked relative to the module rail by means of the slide lock.

Threaded holes for fastening screws are preferably provided in the mounting surface of the bearing block. The fastening screws can be screwed through holes in the panel cover into the threaded holes of the mounting surface. The threaded holes can advantageously have countersinks so that the fastening screws, when screwed into the threaded holes, deform the panel cover so that the screw heads of the fastening screws are closed flush with the outer surface of the panel cover.

Another optional feature according to this disclosure is that the rotary actuator includes an actuating screw, which is mounted to rotate in the bearing block around a rotational axis perpendicular to the mounting surface and passes through the slide lock. A slide nut is provided, which is screwed onto the lower end of the actuating screw and engages in the slide lock. An oblique sliding surface is arranged on the slide lock, on which the slide nut slides so that tightening of the actuating screw relative to the slide nut produces displacement of the slide lock transverse to the rotational axis of the actuating screw.

The slide lock is advantageously arranged on the side of the bearing block facing away from the mounting surface.

The actuating screw, starting from the mounting surface of the bearing block, extends through the bearing block and slide lock arranged on it. A slide nut is screwed onto the free end of the actuating screw so that the slide lock is held between the slide nut and bearing block. By tightening the actuating screw the distance between the slide nut and bearing block is reduced and the slide nut slides on the oblique sliding surface of the slide lock. The slide nut then executes a translatory movement along the axis of the actuating screw. By means of the sliding surface on the slide lock the translatory movement of the slide nut is converted to a translatory movement of the slide lock aligned transverse to it.

The slide nut advantageously has two wedge surfaces, which run at an oblique angle to the rotational axis of the actuating screw. For example, the wedge surfaces are arranged at an angle between 30° and 60°, preferably an angle between 40° and 50°, especially between 43° and 47°. The slide lock has two sliding surfaces corresponding to the wedge surfaces, which run parallel to the wedge surfaces and slide on the wedge surfaces. During tightening of the actuating screw the slide lock is forced on this account in one direction and during loosening of the actuating screw in the opposite direction across the rotational axis of the actuating screw in order to move the slide lock into the release position or locking position. Both the wedge surfaces and the sliding surfaces are preferably situated in the travel direction of the slide lock on opposite sides of the slide nut and slide lock. The wedge surfaces and sliding surfaces represent a simple design possibility in order to convert a linear movement of the slide nut along the rotational axis of the actuating screw to a movement of the slide lock running transverse to it.

In an advantageous modification according to this disclosure the slide lock is locked by the fully tightened actuating screw in the locking position. Uncontrolled movement of the slide lock is therefore prevented so that secure fastening of the panel cover to the module rail is guaranteed. The slide lock is preferably fastened between the bearing block and slide nut.

It is expedient that the head of the actuating screw is closed flush with the mounting surface of the bearing block. Because of this a flat mounting surface is produced, which permits simple mounting of the bearing block on the panel cover.

Another optional feature according to this disclosure is that the head of the actuating screw has an actuator for a screwdriver. Consequently the actuating screw can be conveniently operated with a commercial screwdriver. Rapid and simple tightening and loosening of the actuating screw is therefore guaranteed. The head has an internal hexagon (Inbus) or hexalobular internal (Torx) recess. However, other recesses for screwdrivers with common screwdriver profiles are conceivable.

A stop is advantageously provided on the slide lock, which travels against the actuating screw before it is fully unloosened from the slide nut. The travel path of the slide lock relative to the bearing block can be limited via the stop. In the release position the stop preferably strikes against the actuating screw. In the assembled state of the locking element the head of the actuating screw is supported on the panel cover so that the slide nut migrates downward on the actuating screw. By limiting the travel path of this slide lock with the stop, before the actuating screw is fully loosened from the slide nut, it is guaranteed that the actuating screw or the slide nut cannot be loosened in uncontrolled fashion from the slide nut. The slide lock is also fastened unreleasably to the bearing block on this account. If the locking element is used to fasten a panel cover to a housing, it is guaranteed that no component of the locking element can fall into the interior of the housing, regardless of whether the panel cover is locked or removed.

It is expedient that the actuating screw sits in an elongated hole of the slide lock. Movement of the slide lock relative to the actuating screw and across its axis is therefore possible.

Part of these teachings also include a housing to accommodate electronic components, comprising front and rear module rails of at least one panel cover with holes arranged in a grid pattern and with flanging, which engages in a groove of a module rail. At least one locking element of the type just described is fastened on the inside of the panel cover so that the locking tab engages beneath the module rail in the locking position. For example, the housing is designed as a subrack having two side walls that are joined to each other via horizontal module rails. The panel cover is screwed to the side walls and additionally fastened to the module rails via at least one locking element. Removal of the panel cover from the module rail is therefore prevented.

In a modification of the housing, the threaded holes are arranged in the mounting surface of the bearing block according to the hole pattern in the panel cover. Consequently, no additional holes need be provided to fasten the locking element to the panel cover. Mounting of the locking element on an existing panel cover is therefore possible quickly and simply.

If the rotational axis of the actuating screw is concentric to a hole of the panel cover, it is possible to activate the actuating screw through the panel cover by means of a tool, for example, a screwdriver. The locking element can therefore be activated simply from the outside of the housing through the panel cover. For example, a slide lock can be transferred into the release position from the outside of the housing. The panel cover can therefore be released from the housing again without previous disassembly of electronic components.

The actuating screw must be supported properly against the inside of the panel cover when the head of the actuating screw has a larger diameter than the corresponding hole in the panel cover. If the actuating screw is loosened, it is initially forced upward against the screwed-on slide nut until the head of the actuating screw strikes the panel cover. Further loosening of the actuating screw then exclusively causes movement of the slide nut downward away from the bearing block. If the slide lock is in the release position, for example, the stop of the slide lock strikes against the actuating screw, the slide nut is locked. In the first place, the slide nut cannot move further owing to stop of the slide lock and in the second place it is forced further against the slide lock by the actuating screw, whose head is supported on the panel cover. Owing to locking of the slide nut it is also guaranteed that in the assembled state of the locking element separation of the actuating screw from the slide nut is not possible. No components of the locking element can therefore reach the interior of the housing in uncontrolled fashion.

Positioning pins, which engage in corresponding holes of the panel cover are advantageously formed on the mounting surface of the bearing block. The locking element can thus be positioned quickly and simply relative to the panel cover and precisely aligned. This automatically guarantees mounting of the locking element in the correct position. The positioning pins are preferably arranged on the mounting surface so that in the incorporated state of the locking element positioning of the threaded holes concentric to the holes present in the panel cover necessarily occurs.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DETAILED DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of the present invention.

Figure 1:
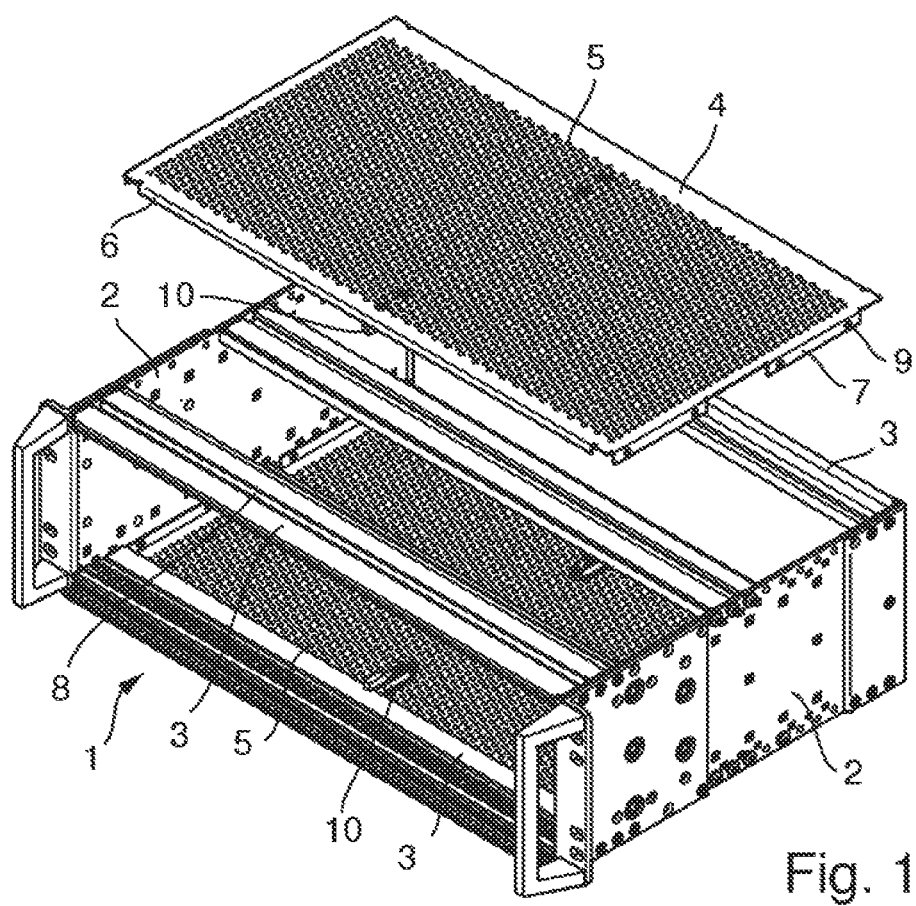
FIG. 1 shows a perspective view of a housing.

FIG. 1 shows an empty housing 1, which is provided to accommodate electrical plug-in units. The housing 1 includes two side walls 2, which are connected to each other via upper and lower module rails 3. Panel covers 4 are provided, which have holes 5 arranged in a grid pattern. The holes 5 fully pass through panel covers 4. The panel covers 4 have first flanging 6 along their long side and second flanging 7 along their short side. Whereas the first flanging 6 engages in grooves 8 of the module rails 3, holes 9 are provided along the second flanging 7, via which the panel cover 4 is joined to the side walls 2 by means of screws. A total of four locking elements 10, for example, are provided on the insides of the panel cover 4.

Figure 2:
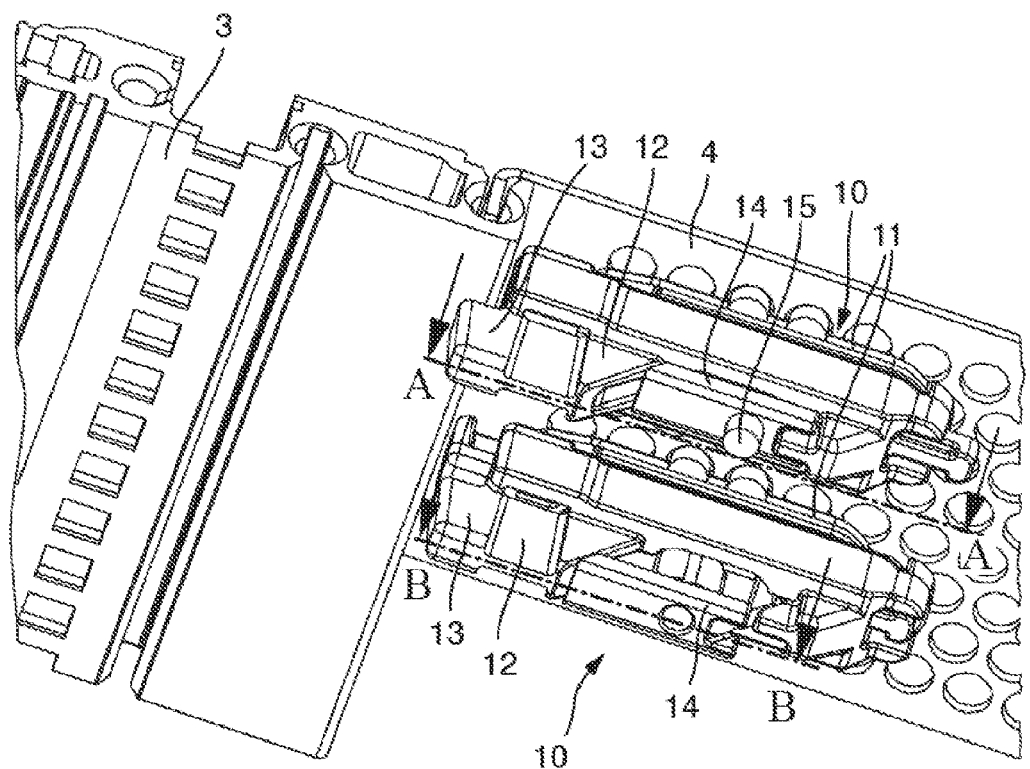
FIG. 2 shows a view of the inside of the panel cover of the housing of FIG. 1 with two installed locking elements on a larger scale.

FIG. 2 shows a cutout of the bottom of the upper panel cover 4 depicted in FIG. 1. In this case, unlike FIG. 1, two locking elements 10 right next to each other can be seen, which will not occur this way in practice.

Each locking element 10 has a bearing block 11, which is fastened to the panel cover 4. Each locking element 10 includes a slide lock 12, which can be moved relative to the bearing block 11 in the longitudinal direction and has a locking tab 13 on its side facing module rail 3. Part of a locking element 10 is also a slide nut 14, which is screwed onto the end of an actuating screw 15. The actuating screw 15 and the slide nut 14 cooperate with the slide lock 12 as a slide mechanism, which moves the slide lock 12 relative to bearing block 11. The actuating screw 15 then serves as rotary actuator of the slide mechanism.

The right locking element 10 in FIG. 2 is situated in a locking position in which the locking tab 13 engages beneath the module rail 3. The left locking element 10, on the other hand, is in a release position. In comparison with the locking position, the slide lock 12 in the release position is moved relative to the bearing block 11 so that the locking tab 13 no longer engages beneath module rail 3. For this purpose the slide lock 12 is pushed rearward away from module rail 3. In the release position the locking tab 13 is therefore arranged at a spacing from module rail 3 so that the module rail 3 is not touched. If all locking elements 10 mounted on the panel cover 4 are in the release position and connections to the side wall 2 are also loosened, the panel cover 4 can be removed from module rail 3.

Figure 3A:
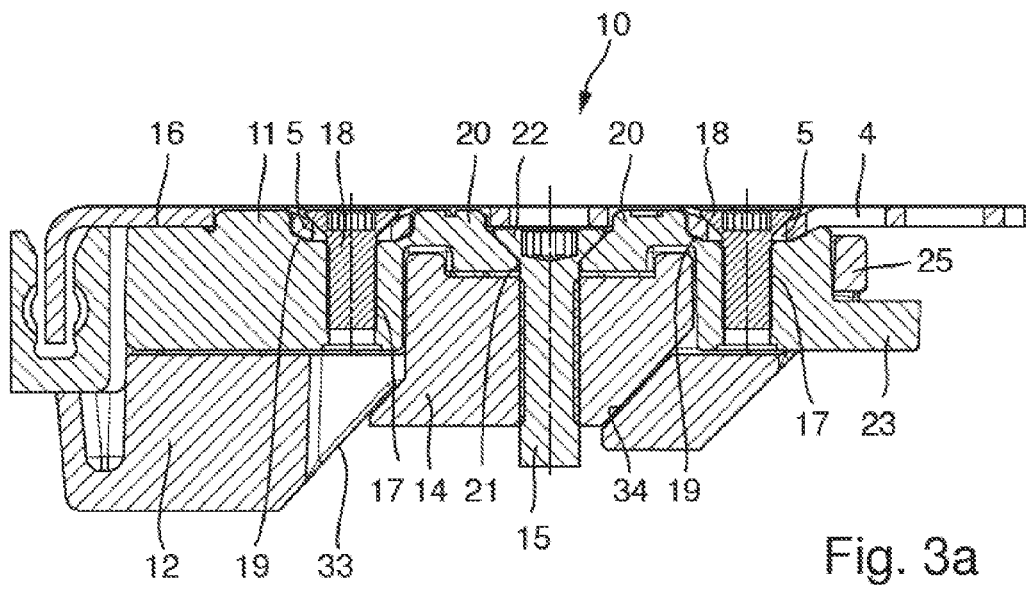
FIG. 3a shows a vertical section along line A-A in FIG. 2.

The details of the locking element 10 and its function will now be further explained with reference to FIGS. 3a, 3b and 4.

The bearing block 11 of the locking element 10 has a mounting surface 16, on which the locking element 10 is connected to the panel cover 4. The mounting surface 16 is designed to be flat or substantially flat and is supported against the inside of panel cover 4. It has threaded holes 17, into which fastening screws 18, which extend through holes 5 in the panel cover 4, are screwed. The fastening screws 18 here are countersunk screws with an internal hexagon. The threaded holes 17 are arranged according to the grid pattern of holes 5. The threaded holes 17 have countersinks 19. If the fastening screws 18 are screwed through holes 5 into threaded holes 17, the fastening screws 18 deform the panel cover 4 so that it is situated in the countersinks of the threaded holes 17. The heads of the fastening screws 18 in panel cover 4 are therefore countersunk and do not extend above the upper surface of the panel cover 4.

Positioning pins 20, which have a circular cross section, are also arranged on the mounting surface 16. The outside diameter of the positioning pins 20 corresponds roughly to the diameter of the holes 5 and panel cover 4. The positioning pins 20 can therefore engage in the holes 5 of the panel cover 4 and serve for precise positioning of the bearing block 11 and therefore locking element 10 relative to panel cover 4. The positioning pins 20 carry markings on the top, for example, direction arrows, which inform the user in which direction the actuating screw 15 must be turned in order to lock or unlock.

The mounting surface 16 also has a hole 21 through which the actuating screw 15 passes. The rotational axis of the actuating screw 15 extends perpendicular to mounting surface 16. Hole 21 is countersunk wedge-like on the mounting surface 16 so that the head 22 of fastening screw 15 is closed off flush with the mounting surface 16 of bearing block 11. As seen in FIG. 3a, the head 22 of actuating screw 15 is arranged between bearing block 11 and panel cover 4. The hole 21 and therefore the position of head 22 is chosen so that the rotational axis of the actuating screw 15 is aligned concentric to a hole 5 in panel cover 4. The head 22 has a larger diameter than the corresponding hole 5 of the panel cover 4. An actuator in the form of a hexalobular internal head (Torx) is provided on its flat top. Consequently, the actuating screw 15 can be activated from the outside of panel cover 4 by means of a corresponding screwdriver through the corresponding hole 5 of the panel cover 4. Since the actuating screws 18 have a different actuator, a different screwdriver is required for their activation so that inadvertent loosening is ruled out.

To guide the slide lock 12 the bearing block 11 has a guide protrusion 23 and on the opposite side of the bearing block 11 an L-shaped guide shoulder 24. A bracket 25 is provided on the slide lock 12, which is engaged behind by the guide protrusion 23. The slide lock 12 also has protrusions 26 that engage behind the L-shaped guide shoulder 24. Through cooperation of the guide protrusion 23 and the bracket 25, on the one hand, and the L-shaped guide shoulder 24 and the protrusions 26, on the other, guiding of the slide lock 12 along bearing block 11 is accomplished. Moreover, removal of the slide lock 12 from the bearing block 11 in a direction facing away from panel cover 4 between the locking and release position of the slide lock 12 is prevented. Separation of the bearing block 11 from the slide lock 12 is only possible with a completely unscrewed actuating screw 15 and disassembled slide nut 14. In addition, the slide lock 12 must be pushed relative to bearing block 11, coming from the locking position, beyond the release position.

The slide lock 12 has an elongated hole 27, in which the actuating screw 15 sits. The actuating screw 15 is arranged in the hole 21 of mounting surface 16, passes through elongated hole 27 and is screwed to the slide nut 14 on its free end. The slide nut 14 moves perpendicular to panel cover 4. Guiding of the slide nut 14 then occurs through guide surfaces 28 on bearing block 11, along which the slide nut 14 slides up and down. The slide nut 14 has a plate 29 on its side facing away from the panel cover 4, with which it lies on the edge 30 of elongated hole 27, when the actuating screw 15 is tightened.

In order to produce movement of the slide lock 12 relative to the bearing block 11, the slide nut 14 has a first wedge surface 31 and a second wedge surface 32, which are arranged at an oblique angle of about 45° to panel cover 4. Two sliding surfaces 33, 34 are formed on the slide lock 12 corresponding to wedge surfaces 31, 32.

These sliding surfaces 33, 34 are parallel to both wedge surfaces 31, 32 and to each other. The wedge surfaces 31, 32 also run parallel to each other. Both the wedge surfaces 31, 32 and the sliding surfaces 33, 34 are situated on opposite sides of the slide nut 14 and slide lock 12 in the travel direction of the slide lock 12. The slide nut 14 can slide up and down with its wedge surfaces 31, 32 on the sliding surfaces 33, 34 of the slide lock 12.

Starting from the locking position, movement of the slide lock 12 into the release position and back into the locking position will be further explained below.

In the locking position (FIG. 3a) the actuating screw 15 is completely tightened and the slide nut 14 is situated on bearing block 11. The slide lock 12 is clamped between plate 29 of the slide nut 14 and bearing block 11 and therefore locked. The slide nut 14 is arranged, except for plate 29, completely in the elongated hole 27 of the slide lock 12. On the side of the slide nut 14 facing the bearing block 11 it has tabs 35 that engage in recesses 36 on bearing block 11.

Figure 3B:
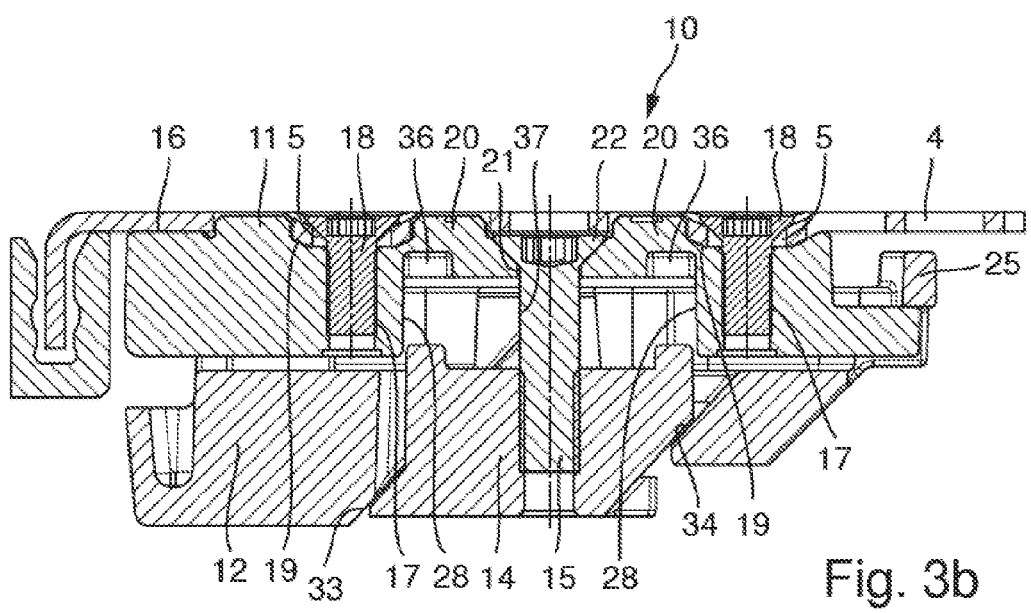
FIG. 3b shows a vertical section along line B-B in FIG. 2.
Figure 4:
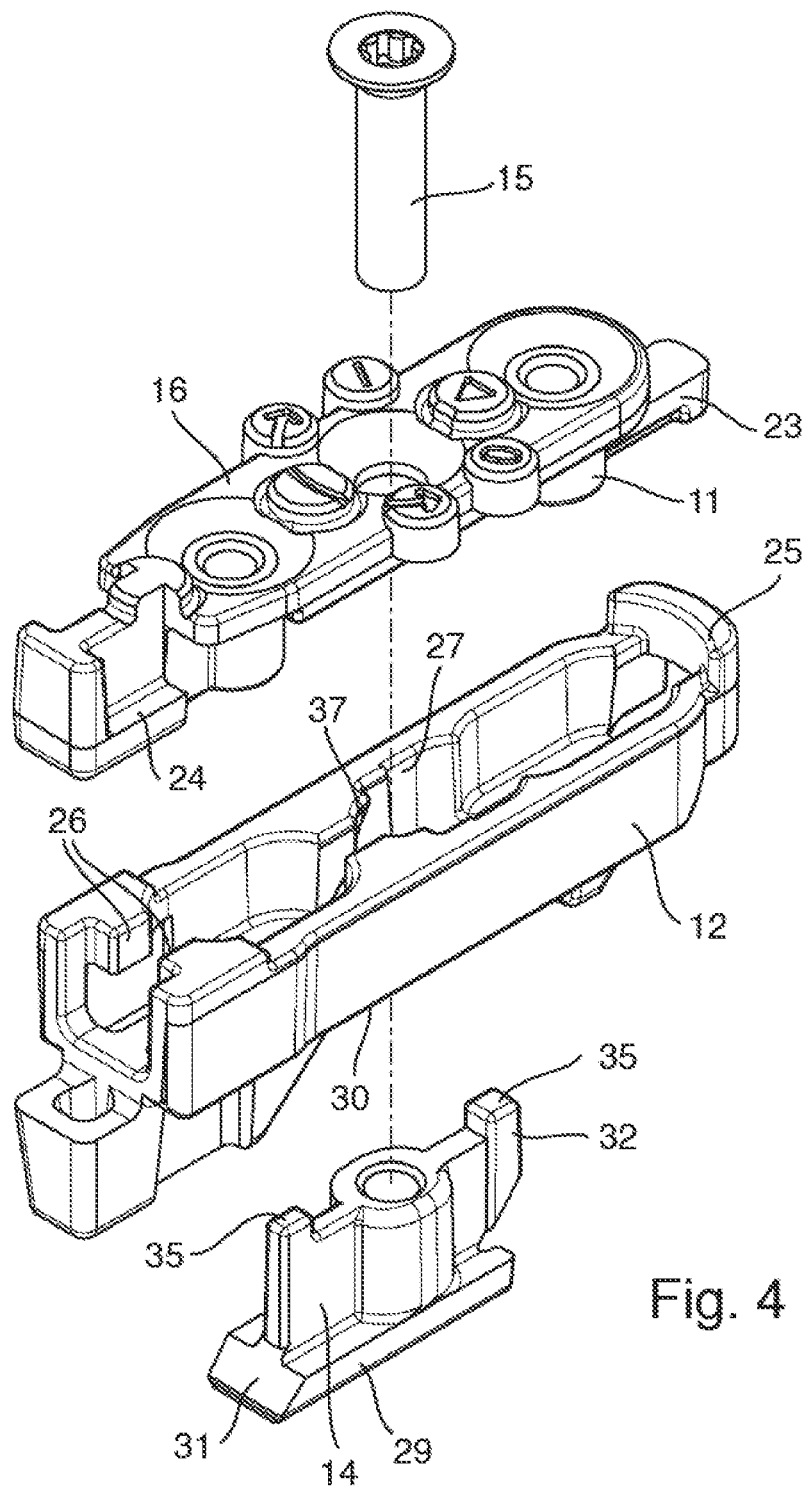
FIG. 4 shows a perspective exploded drawing of a locking element of FIG. 2.

FIG. 3b shows the locking element 10 in the release position. Transfer of the slide lock 12 from the locking position to the release occurs by loosening the actuating screw 15. Since the diameter of the head 22 of actuating screw 15 is larger than that of hole 5 and panel cover 4, the head 22 during loosening of the actuating screw 15 is supported on the panel cover 4. Because of this, loosening of the actuating screw 15 leads to movement of the slide nut 14 along the rotational axis of the actuating screw 15 away from bearing block 11, i.e., downward in FIG. 3b. The second wedge surface 32 of slide nut 14 then slides on the second sliding surface 34 of the slide lock 12. This forces the slide lock 12 to move parallel to bearing block 11 in the direction of the release position. The slide lock 12 travels parallel to the bearing block 11 until a stop 37 of the slide lock 12 strikes the actuating screw 15 and therefore limits the travel movement of the slide lock 12. The release position is therefore reached; the slide nut 14 forces the slide lock 12 against stop 37 with its second wedge surface 32. Removal of the slide lock 12 from the bearing block 11 is prevented by the guide protrusion 23 and the L-shaped guide shoulder 24. Since the head 22 of actuating screw 15 is supported against panel cover 4, the actuating screw 15 can no longer be unscrewed from the slide nut 14. The slide lock 12 and the slide nut 14 are therefore locked in the release position. Consequently, no component of the locking element 10 can fall into the interior of the housing in the release position.

Movement of the slide lock 12 from the release position to the locking position occurs by tightening actuating screw 15. During tightening of the actuating screw 15 the slide nut 14 travels along the rotational axis of the actuating screw 15 to bearing block 11, i.e., upward in the figures. The first wedge surface 31 then slides on the first sliding surface 33. This causes movement of the slide lock 12 transverse to the rotational axis of the actuating screw 15 in the direction of the locking position. This movement is limited by the fact that the plate 29, on reaching the locking position, stops on the edge 30 of the elongated hole and therefore on slide lock 12 and locks it, as described above.

While exemplary embodiments have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

| | List of reference numbers |
|---|---|
| 1 | Housing |
| 2 | Side wall |
| 3 | Module rail |
| 4 | Panel cover |
| 5 | Holes (in panel cover) |
| 6 | First flanging |
| 7 | Second flanging |
| 8 | Groove |
| 9 | Hole (in panel cover for fastening) |
| 10 | Locking element |
| 11 | Bearing block |
| 12 | Slide lock |
| 13 | Locking tab |
| 14 | Slide nut |
| 15 | Actuating screw |
| 16 | Mounting surface |
| 17 | Threaded holes (in bearing block) |
| 18 | Fastening screws |
| 19 | Countersinks (in the mounting surface) |
| 20 | Positioning pins |
| 21 | Hole (in the mounting surface) |

| | List of reference numbers |
|---|---|
| 22 | Head (actuating screw) |
| 23 | Guide protrusion (on the bearing block) |
| 24 | L-shaped guide shoulder (on the bearing block) |
| 25 | Bracket (on the slide lock) |
| 26 | Protrusion (on the slide lock) |
| 27 | Elongated hole (in the slide lock) |
| 28 | Guide surfaces (on the bearing block) |
| 29 | Plate (on the slide nut) |
| 30 | Edge (elongated hole) |
| 31, 32 | First, second wedge surfaces (on the slide nut) |
| 33, 34 | First, second sliding surfaces (on the slide lock) |
| 35 | Tab (on the slide nut) |
| 36 | Recess (bearing block) |
| 37 | Stop (on the slide lock) |

What is claimed is:

1. A locking element configured for locking of a panel cover on a module rail, the locking element comprising:
   a bearing block with a mounting surface and having fasteners configured for mounting on the inside of the panel cover;
   a slide lock movably mounted on the bearing block and having a locking tab;
   an actuating screw passing through the slide lock, the actuating screw being actuable in the installed locking element, the actuating screw configured to be accessible through a hole in the panel cover; and
   a slide nut screwed onto the lower end of the actuating screw;
   wherein, turning the actuating screw causes the slide nut to engage and move the slide lock from a locked position in which the locking tab is configured to engage beneath the module rail to a release position, and vice versa.

2. The locking element of claim 1, further comprising threaded holes disposed in the mounting surface of the bearing block adapted to receive fastening screws.

3. The locking element of claim 2, wherein the threaded holes have countersinks.

4. The locking element of claim 1, wherein:
   the actuating screw is configured to rotate in the bearing block around a rotational axis perpendicular to the mounting surface; and
   an oblique sliding surface is arranged on the slide lock, on which the slide nut slides so that tightening of the actuating screw relative to the slide nut produces movement of the slide lock transverse to the rotational axis of the actuating screw.

5. The locking element of claim 4, wherein:
   the slide nut has two wedge surfaces oriented at an oblique angle to the rotational axis of the actuating screw;
   the slide lock has two corresponding sliding surfaces which extend parallel to the wedge surfaces and on which the wedge surfaces slide so that during tightening of the actuating screw the slide lock is forced in one direction and during loosening of the actuating screw the slide lock is forced in the opposite direction.

6. The locking element of claim 4, wherein the slide lock is locked by the completely tightened actuating screw in the locked position.

7. The locking element of claim 4, wherein the head of the actuating screw is closed off flush with the mounting surface of bearing block.

8. The locking element of claim 4, wherein the head of the actuating screw has an actuator for a screwdriver.

9. The locking element of claim 4, further comprising a stop on the slide lock, the stop traveling against the actuating screw before it is loosened entirely from the slide nut.

10. The locking element of claim 4, wherein the actuating screw sits in an elongated hole of the slide lock.

11. A housing to accommodate electronic components, comprising:
    front and rear module rails;
    at least one panel cover with holes arranged in a grid pattern and having a flanging which engages in a groove of a module rail; and
    at least one locking element according to claim 1 fastened on the inside of the panel cover so that the locking tab engages beneath the module rail in the locked position.

12. The housing of claim 11, further comprising threaded holes disposed in the mounting service of the bearing block adapted to receive fastening screws, wherein the threaded holes are arranged in the mounting surface of the bearing block of the hole pattern in the panel cover.

13. The housing of claim 12, wherein the threaded holes have countersinks, wherein the rotational axis of the actuating screw is concentric to a hole of the panel cover.

14. The housing of claim 13, wherein the head of the actuating screw has a larger diameter than the corresponding hole in the panel cover.

15. The housing of claim 12, further comprising positioning pins formed on the mounting surface of the bearing block, the positioning pins engaging in the holes of the panel cover.

\* \* \* \* \*